United States Patent [19]
Fernald

[11] Patent Number: 5,543,795
[45] Date of Patent: Aug. 6, 1996

[54] HYBRID ANALOG-TO-DIGITAL CONVERTOR FOR LOW POWER APPLICATIONS, SUCH AS USE IN AN IMPLANTABLE MEDICAL DEVICE

[75] Inventor: Kenneth W. Fernald, Lake Jackson, Tex.

[73] Assignee: Intermedics, Inc., Angleton, Tex.

[21] Appl. No.: 460,139

[22] Filed: Jun. 2, 1995

[51] Int. Cl.⁶ .................................................. H03M 1/40
[52] U.S. Cl. ........................... 341/163; 341/158; 341/162
[58] Field of Search .................................. 341/164, 165, 341/163, 141

[56] References Cited

U.S. PATENT DOCUMENTS

| | | | |
|---|---|---|---|
| 3,879,724 | 4/1975 | McDonald . | |
| 3,978,472 | 8/1976 | Jones . | |
| 4,270,077 | 5/1981 | Swartz | 318/661 |
| 4,308,524 | 12/1981 | Harrison . | |
| 4,454,500 | 6/1984 | Kato . | |
| 4,471,341 | 9/1984 | Sauer | 340/347 |
| 4,553,128 | 11/1985 | Pilost | 340/347 |
| 4,771,266 | 9/1988 | Nunokawa | 341/161 |
| 4,792,787 | 12/1988 | Speiser et al. | 341/156 |
| 4,983,969 | 1/1991 | Iwamoto | 341/118 |
| 5,014,056 | 5/1991 | Moriwaki | 341/161 |
| 5,017,920 | 5/1991 | French | 341/163 |
| 5,023,611 | 6/1991 | Chamzas et al. | 341/51 |
| 5,025,258 | 6/1991 | Duttweiler | 341/107 |
| 5,028,926 | 7/1991 | Tokuhiro | 341/161 |
| 5,057,841 | 10/1991 | Veerhoek et al. | 341/156 |
| 5,081,454 | 1/1992 | Campbell, Jr. et al. | 341/141 |
| 5,144,310 | 9/1992 | Sato | 341/161 |
| 5,184,131 | 2/1993 | Ikeda | 341/165 |
| 5,206,650 | 4/1993 | Parle et al. | 341/163 |
| 5,262,779 | 11/1993 | Sauer | 341/161 |
| 5,274,377 | 12/1993 | Matsuura et al. | 341/161 |

*Primary Examiner*—Jeffrey A. Gaffin
*Assistant Examiner*—Peguy JeanPierre
*Attorney, Agent, or Firm*—Michael F. Heim; David S. Wise; John Merkling

[57] ABSTRACT

A method and apparatus is disclosed for an analog-to-digital converter (ADC) to minimize power consumption. The ADC of the present invention minimizes the number of clock cycles required to determine the correct digital code for a particular sample point on an electrogram signal, thus making it possible to turn off some or all of the ADC logic during idle periods. The ADC includes prediction logic that provides a starting point for subsequent digital code representations of the electrogram signal. The prediction logic receives recent code conversions values to predict a current digital code value. This predicted digital code is converted to an analog value and compared with the actual electrogram signal. Next, the ADC adds (or subtracts) a constant value (C) to (or from) the predicted code and compares the result to the electrogram signal. If the ADC determines that the predicted value is within the constant value (C) of the correct digital code, then the ADC counts in the proper direction until the comparator changes output state. If the ADC determines that the predicted value is not within the constant value (C), then the successive approximation logic is enabled and used to find the correct code.

37 Claims, 5 Drawing Sheets

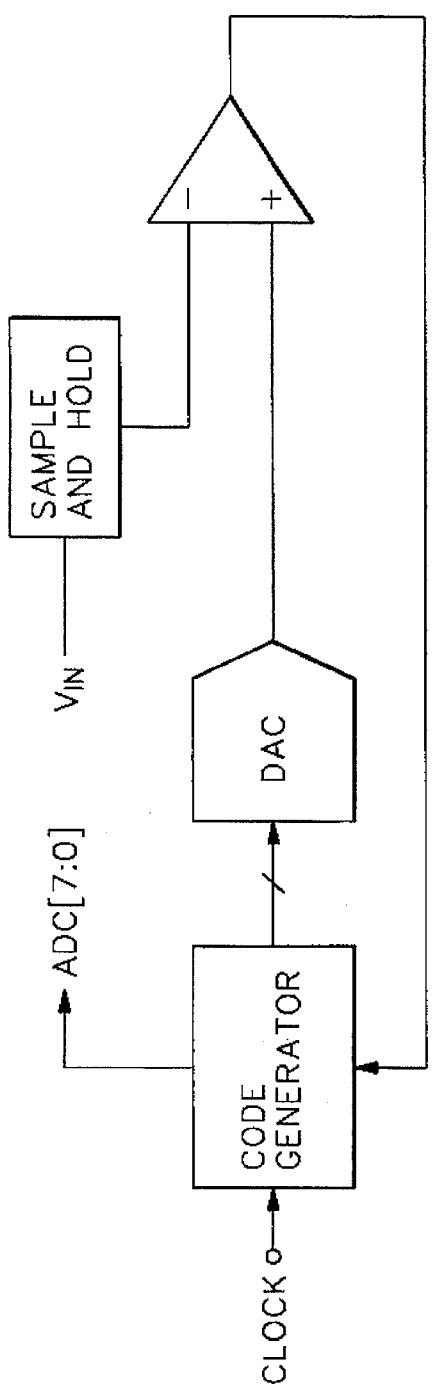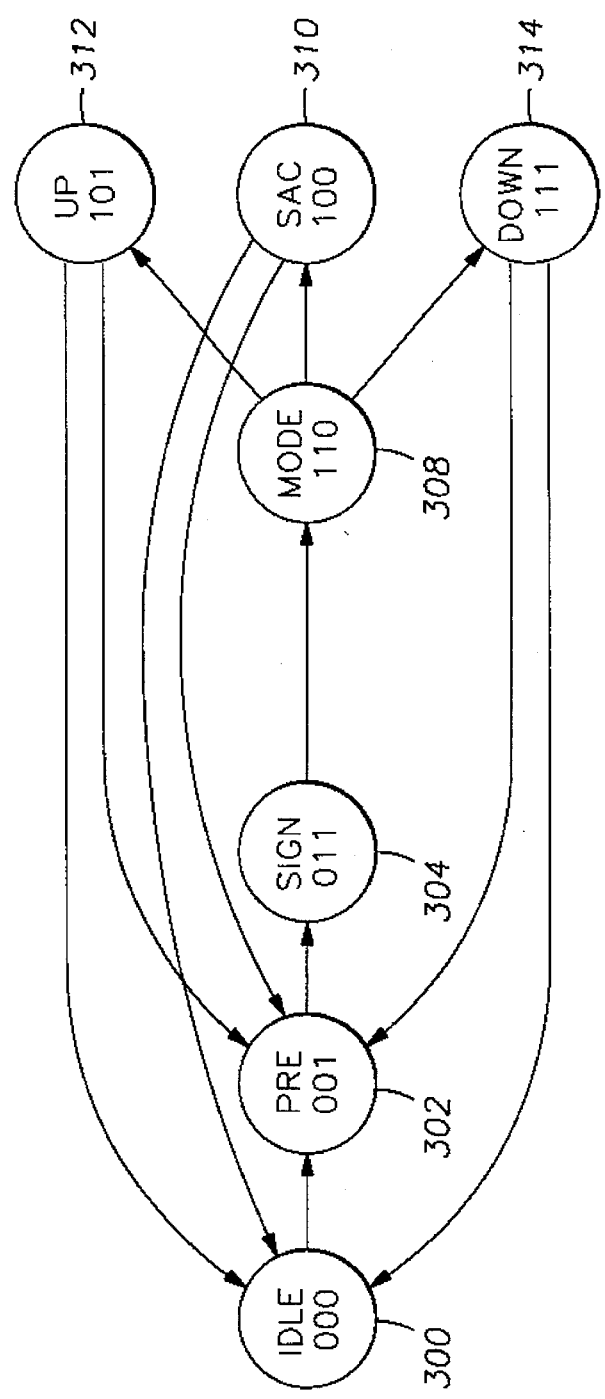

HYBRID ANALOG-TO-DIGITAL CONVERTOR FOR LOW POWER APPLICATIONS, SUCH AS USE IN AN IMPLANTABLE MEDICAL DEVICE

BACKGROUND OF THE INVENTION

The present invention relates generally to a low power analog-to-digital convertor for converting analog signals to digital values. More particularly, the present invention relates to an analog-to-digital convertor comprising part of a waveform storage circuit for use in low power applications, such as use in an implantable medical device. Still more particularly, the present invention relates to an analog-to-digital circuit with the ability to predict the digital conversion value based upon previously converted analog signals, and which selects a conversion technique depending upon the accuracy of the prediction.

Disruption of natural pacemaking capabilities of the heart as a result of aging or disease commonly is treated by the insertion into a patient of an artificial cardiac pacing device, commonly referred to as a pacemaker. A pacemaker provides rhythmic electrical discharges that are applied to the heart at a desired rate from the implanted artificial pacemaker. In its simplest form, the pacemaker consists of a pulse generator powered by a self-contained battery pack, and a lead including at least one stimulating electrode(s) for delivery of electrical impulses to excitable myocardial tissue in the appropriate chamber(s) in the right side of the patient's heart. In some instances, epicardial electrodes are implanted by surgically splitting the patient's chest or according to other well known techniques, and suturing or screwing them in to the epicardium. Typically, the pulse generator is surgically implanted in a subcutaneous pouch in the patient's chest. In operation, the electrical stimuli are delivered to the excitable cardiac tissue via an electrical circuit that includes the stimulating and reference electrodes, and the body tissue and fluids.

Pacemakers range from the simple fixed rate device that provides pacing with no sensing function, to highly complex models implemented to provide fully automatic dual chamber pacing and sensing functions. The latter type of pacemaker is the latest in a progression toward psychologic pacing; that is, the mode of artificial pacing that restores cardiac function as much as possible toward natural pacing.

Typically, and as shown in FIG. 1, an implantable medical device 12, such as a pacemaker, for example, comprises electrical circuits that are controlled by processing circuitry 26, such as a central processing unit (CPU) or microprocessor. Because of the implementation of the microprocessor in the pacemaker or other implantable device, the pacemaker can be programmed by a physician through an external device 10 to customize the operation of the device to the patient's conditions. As shown in FIG. 1, the pacemaker or other implantable device 12 includes a coil antenna 30 which is capable of communicating through electromagnetic waves to a coil antenna 24 in the external programmer/ reader 20 in the external device 10. The pacemaker can be programmed after it is implanted in the patient 14 through electromagnetic signals transmitted by the external programmer. The pacemaker 12 attaches to the patient's heart 16 through electrical leads 18. The pacemaker also includes a communications interface 28 to transmit and receive signals through an antenna 30. Similarly, the external device 10 also includes a communications interface 22 connected to antenna 24.

The pacemaker circuitry typically is powered by a battery pack 32 that is surgically implanted at the same time as the pacemaker. When the battery pack 32 reaches the end of its useful life, it must be either replaced or recharged. If the battery pack 32 must be replaced, another surgical procedure is necessary to make the replacement. Power consumption of pacemaker circuitry, therefore, is critical.

In addition to the microprocessor, the pacemaker also may include a memory device 35, such as random access memory (RAM) chips, for storing signals indicative of the patient's health. The pacemaker may have the capability of monitoring physiological parameters of the patient, such as electrocardiogram (or EKG) signals, and may store digital signals representative of these parameters in the memory device 35. When prompted by the external device, the processing circuitry 26 can transmit the contents of the memory device 35 to the external programmer/reader 20 for analysis by the physician. According to conventional digital processing techniques, a clock signal is provided by an internal clock 36 which synchronizes the activities of the processing circuitry 26 and memory 35.

The conversion of electrical analog signals (electrograms), such as EKG signals, into digital values for storage in memory raises concerns regarding power consumption, accuracy and timeliness associated with the conversion process. A conventional architecture for an analog-to-digital convertor (or ADC) is shown for purposes of illustration in FIG. 2. The ADC of FIG. 2 includes a code generator device with a digital-to-analog converter (DAC), followed by a comparator that compares the output of the DAC with the analog voltage signal obtained from a sample and hold circuit. The analog-to-digital conversion is performed according to conventional techniques by driving different digital codes into the DAC until the resulting DAC output is approximately equal to the analog voltage to be digitized. At that time, an ADC output signal, shown as ADC[7:0], is provided as an output of the code generator circuitry. If an eight-bit digital code is used, then 256 coded values (2'=256) are available to encode the electrogram signal.

The most common algorithm for generating the digital codes (which are supplied as inputs to the DAC) is called successive-approximation. Successive-approximation involves a bilinear search for the correct digital code by first setting the most significant digital bit high with all lower bits low, and observing the comparator output to determine whether the analog value is in the lower or upper half of the available code space. If the comparator indicates that the actual analog signal has a magnitude greater than the mid value, then the most significant bit is indicated as a digital "1". Conversely, if the actual analog signal has a magnitude less than the mid value, then the most significant bit is indicated as a digital "0".

The successive-approximation algorithm is repeated on each successive bit to determine whether that bit should be assigned a value of "0" or "1". The process therefore is performed once for each bit of the desired digital code width, so that if an eight bit digital code is available, the successive-approximation method is repeated eight times (once each dock cycle) to determine the value of the digital code. Example of successive-approximation ADC's are illustrated in U.S. Pat. Nos. 5,017,920, 5,028,926, 5,057, 841, 5,206,650, 5,144,310, 5,262,779. Successive approximation ADC's are typically used in implantable medical devices.

An alternative algorithm that can be used to generate the digital code input to the DAC involves a linear search for the best digital representation of the analog value. This linear search algorithm starts at either the minimum or maximum digital code value and either increments or decrements the digital value once each dock cycle until the comparator output changes state, thus indicating that the correct digital representation of the analog signal has been reached. This type of linear searching for the digital representation of the analog signal provides a much slower conversion time than the successive-approximation technique unless the correct digital code is near the starting digital value used by the linear search algorithm. For an eight bit digital code space, the linear search algorithm can take anywhere from 1 attempt to 255 attempts to determine the proper digital representation of the analog signal.

The vast majority of the power consumed by the ADC shown in FIG. 2 may be attributed to the quiescent bias current of the comparator. Consequently, the average power consumed for each analog-to-digital conversion can be reduced significantly by reducing the number of operations or comparisons performed by the ADC, and thus the amount of time the comparator must remain enabled. It is an object of the present invention to develop an ADC that optimizes the code generation of FIG. 2 to minimize the number of clock cycles necessary to perform the digital conversion of the analog signal.

While the benefits of such an ADC are apparent, particularly in low power applications such as an implantable medical device, to date no such power saving ADC has been developed.

SUMMARY OF THE INVENTION

The present invention solves the shortcomings and deficiencies of the prior art by constructing a low power analog-to-digital converter (ADC) for an implantable device which provides significant power savings over other commercially available ADC designs. The ADC of the present invention includes prediction circuitry to predict the correct digital code value for the analog electrogram signal. The predicted value is compared by a comparator to the magnitude of the actual electrogram signal to determine if the prediction is high or low, thus providing a direction for subsequent searching. A constant (C) then is added or subtracted to the predicted value, based upon the results of the first comparison, to obtain a result that also is compared to the magnitude of the analog signal. The comparator therefore is used to determine if the correct digital code lies between the predicted value and the predicted value plus or minus the constant. If the correct digital code does lie between the predicted value and the predicted value plus or minus a constant, then the control circuitry for the ADC implements a linear search algorithm which uses the predicted digital value as the starting point, and searches in the direction indicated by the initial comparison with the predicted value. The linear search algorithm is used because of the realization that the predicted value is within C search steps from the correct code value. If, conversely, the correct digital code does not lie between the predicted value and the predicted value plus or minus a constant, then the control circuitry for the ADC implements a successive-approximation algorithm to find the correct digital code. The constant value C is chosen to be approximately equal to the number of steps it would take to find the digital code using the successive-approximation technique.

The code generator of the present invention includes prediction circuitry for providing a guess of what the correct digital code will be for an analog signal. In one embodiment, the prediction circuitry uses the correct digital code for the previous analog signal as the predicted digital code value. As an alternative, the prediction circuitry may provide a linear prediction by calculating the rate at which the digital code is changing by looking at the previous two digital code values, and then predicting what the next code will be based upon the rate of change and the last digital value.

The code generator also includes a counter for performing the linear search algorithm. The counter receives the predicted digital value as the starting point for the linear search. Similarly, successive approximation circuitry also is provided to implement the successive approximation search algorithm. The prediction circuitry, counter, and successive-approximation circuitry all couple to a multiplexer via one or more parallel buses. The output of the multiplexer connects as one input to a digital adder. The digital adder also receives as an input the output of a second multiplexer. The second multiplexer receives as inputs 0, C and –C. Control circuitry is provided which controls the input lines selected by both the first multiplexer and the second multiplexer. The control circuitry, therefore, determines whether the counter or successive approximation circuitry will be connected to the adder. Similarly, the control circuitry determines whether 0, C or –C will be connected the adder. The output of the adder is provided to a digital-to-analog convertor (DAC), which converts the digital code into an analog value. The converted analog value is compared with the analog input in a comparator, and the output of the comparator is provided as an input to the control circuitry.

BRIEF DESCRIPTION OF THE DRAWINGS

For a more detailed description of the preferred embodiment of the present invention, reference will now be made to the accompanying drawings, wherein:

FIG. 2 depicts a functional block diagram of a conventional analog-to-digital converter;

FIG. 3 illustrates a state diagram for the ADC of FIG. 5.

DETAILED DESCRIPTION OF THE PREFERRED EMBODIMENT

The present invention is designed specifically for an implantable medical device which is capable of sensing electrical analog waveforms indicative of certain physiological parameters (commonly referred to as "electrograms"), and which can convert those analog signals quickly and efficiently into a digital code that can be stored in memory. An exemplary embodiment for such an implantable medical device may be a pacemaker that is capable of receiving electrocardiogram (EKG) signals, and which converts those EKG signals into an eight bit digital code. One skilled in the art will understand, however, that the techniques of the present invention may be used in any implantable device measuring any suitable electrogram signal, to minimize the power consumed in converting an analog signal to a digital signal.

Figure 1:
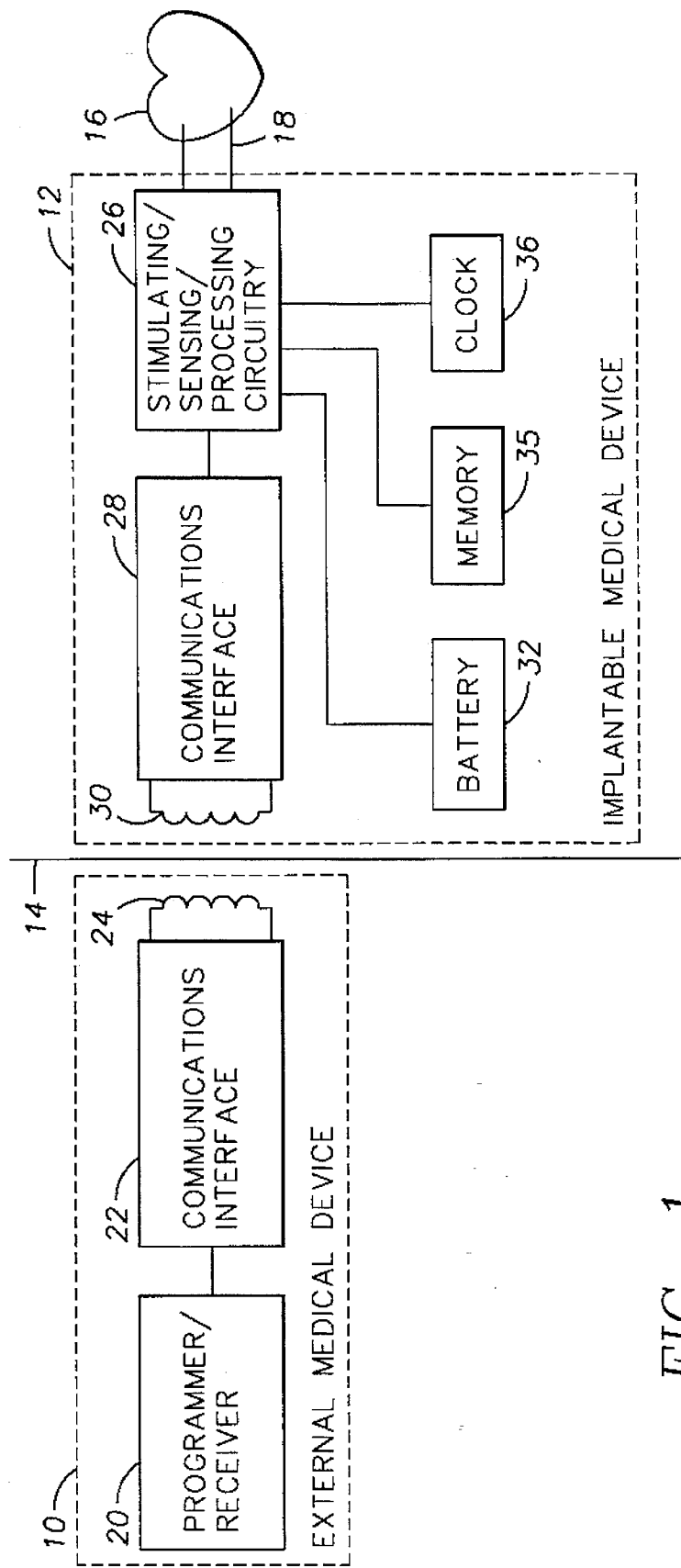
FIG. 1 is a functional block diagram illustrating a pacemaker and associated electronic circuitry.
Figure 4:
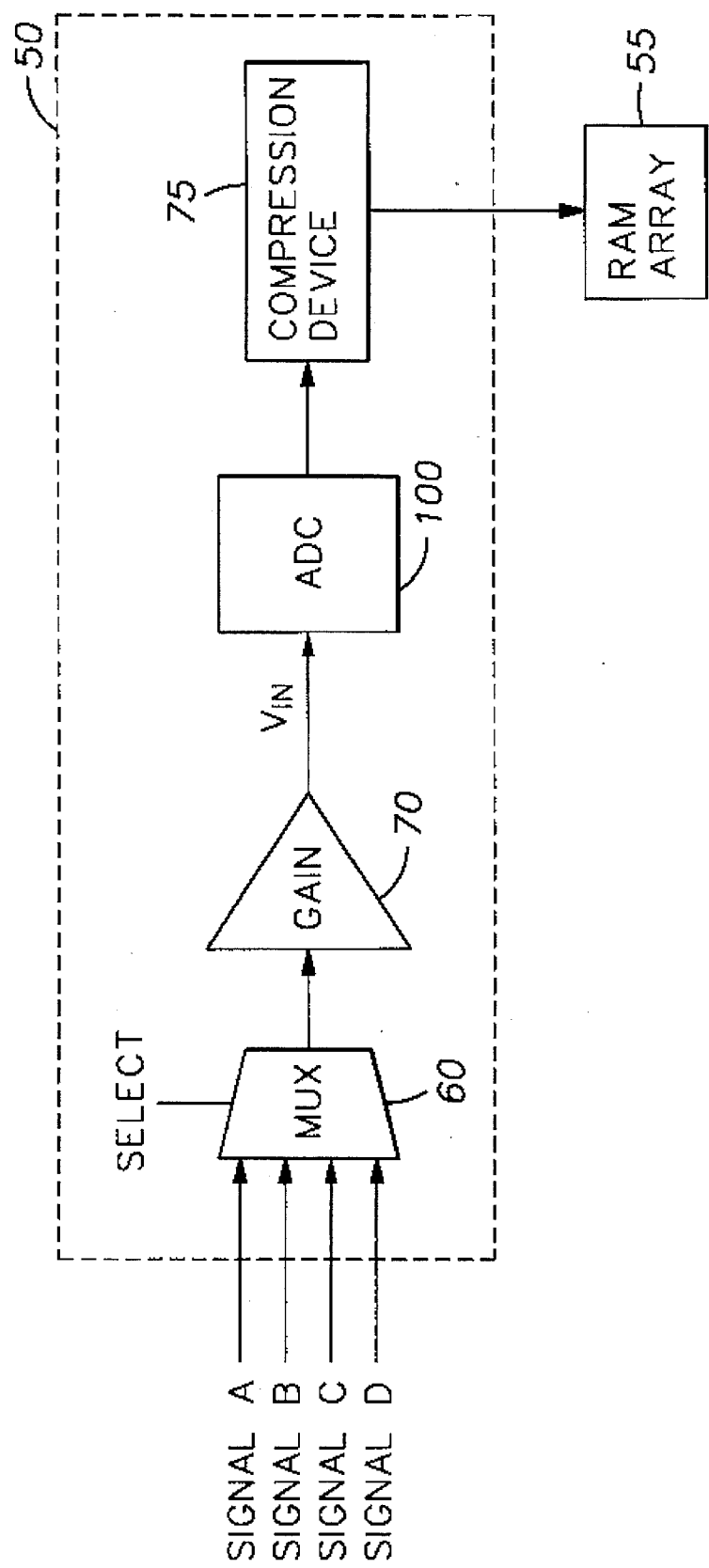
FIG. 4 is a functional block diagram of the sensing circuitry of FIG. 1.

Referring initially to FIG. 4, the present invention may be used in an implantable medical device, which includes waveform circuitry 50 for receiving one or more analog signals (shown as Signals A, B, C, D, for example), and producing a digital code that is stored in the random access memory (RAM) array 55. In the preferred embodiment, the waveform circuitry 50 includes a multiplexer 60, for selecting the particular input signal, a gain amplifier 70, an analog-to-digital convertor 100, and a compression device 75.

The multiplexer 60 receives as inputs the various available analog signals, shown in FIG. 4 to include signals A, B, C, D. The multiplexer also receives a select input, which controls the input that is gated through to the multiplexer output terminal, in accordance with conventional techniques. The select input may be provided from control circuitry in the waveform storage circuitry 55, or from other control circuitry, such as a processor, in the implantable device. The gain amplifier 70 receives the multiplexer output signal and amplifies the signal in accordance with normal convention. The amplifier 70 can be designed to provide different gain values dependent upon the input selected by the multiplexer 60, if desired.

Referring still to FIG. 4, the ADC 100 receives the analog signal amplified by the gain amplifier 70, and converts this analog signal to a digital code of a desired length. In the preferred embodiment, the digital code preferably is eight bits wide. As one skilled in the art will understand, the digital code could have a greater or lesser bit width, as desired. As will be discussed in more detail below, the ADC 100 preferably is designed to minimize the number of clock cycles required for the conversion, to minimize the power consumed by the ADC. The ADC tends to require a relatively large amount of operational power. By minimizing power consumption of the ADC, the life expectancy of the battery can be significantly extended, delaying the necessity of surgical procedures, or other procedures necessitated by a dying battery in an implantable medical device. The ADC 100 constructed according to the preferred embodiment is capable of conserving approximately 30% of the power which otherwise would be consumed. The compression device 75 functions to compress the digital code produced by the ADC 100 prior to storage in the RAM array 55, to conserve memory space. In the preferred embodiment, the compression device 75 implements a lossy piecewise linearization algorithm to compress the digital code.

Figure 5:
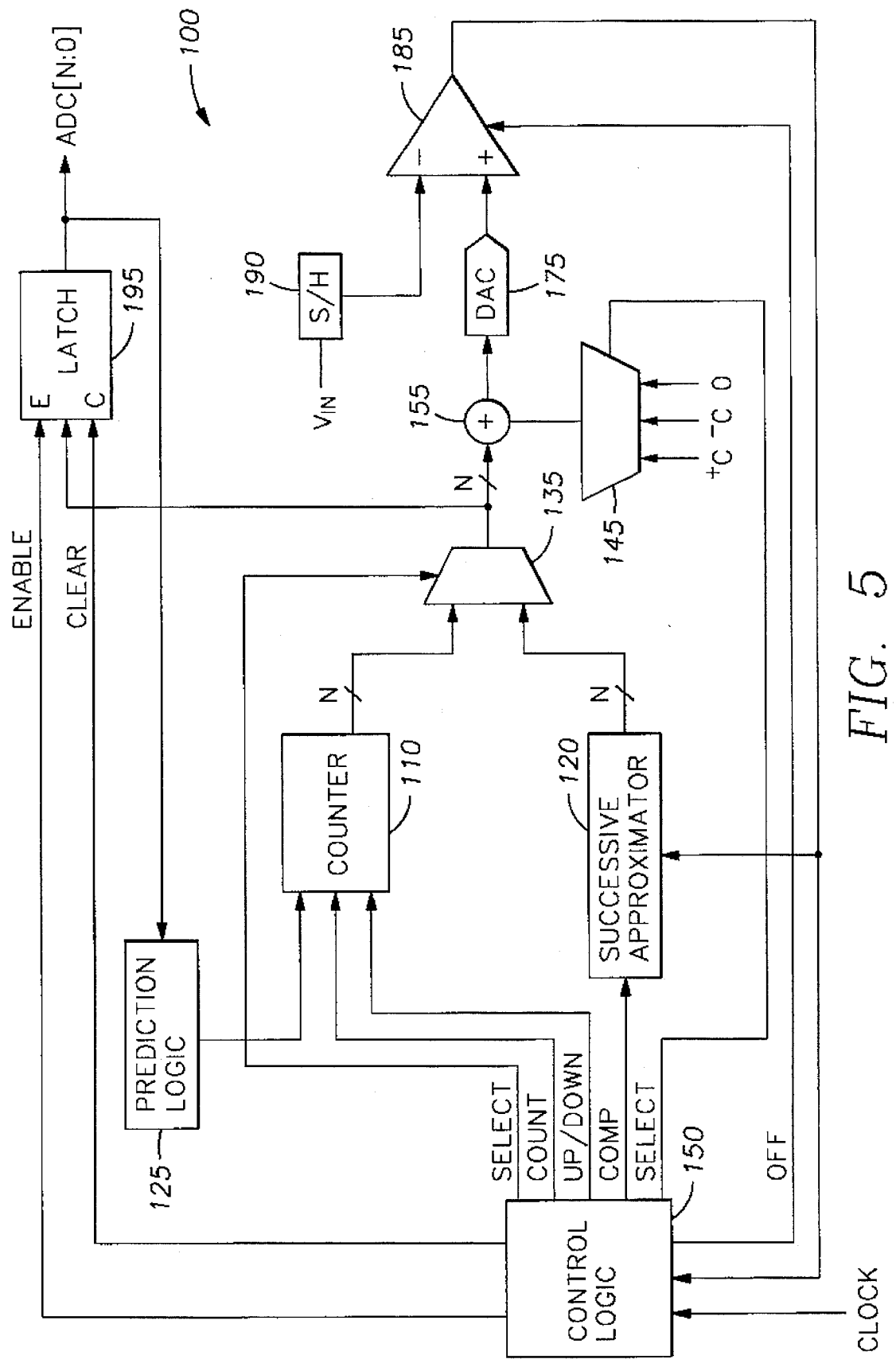
FIG. 5 is a functional block diagram of an analog-to-digital converter constructed in accordance with the preferred embodiment.

The ADC 100 will be discussed in more detail with reference to the block diagram representation of FIG. 5. According to the preferred embodiment, the ADC 100 preferably comprises prediction logic 125, a digital counter 110, successive approximation logic 120, control logic 150, an adder 155, a digital-to-analog converter (DAC) 175, and a comparator 185. As shown in FIG. 5, a control multiplexer 135 and a constant multiplexer 145 preferably are provided to select appropriate inputs for the adder 155, as will be discussed. According to the preferred embodiment, the ADC 100 converts an electrogram signal into a digital code with a minimum number of clock cycles. When the correct digital code is found by the ADC 100, the comparator 185 and other desired circuitry in the ADC 100 are turned off, or placed in an idle state, until another conversion is required. Preferably, the circuitry of the present invention is implemented with CMOS (complementary metal-oxide semiconductor) technology.

The ADC 100 performs iterative "guesses," "predictions" or "searches" to determine the correct digital code for the electrogram signal provided as an input to the ADC 100. Each of the digital code predicitions made during the searching process are converted back into an analog signal by the DAC 175, and this analog signal is compared with the electrogram signal in comparator 185. The output of the comparator 185 is monitored to determine when the output of the comparator 185 changes state. When a state change is detected, the predicted digital code value is accepted as the correct digital code for that particular electrogram signal, and the search is concluded. The predicted digital code value then is provided as the output signal ADC[N:0] of the ADC 100.

In the preferred embodiment, a new digital code is generated during each clock cycle during the searching process, and a new search for a digital code representation is performed for each sampling point of the electrogram signal. The sampling rate of the electrogram signal preferably is programmable in the present invention. An exemplary sampling rate for the electrogram signal could be on the order of 260 Hz, which requires a digital conversion code to be generated once approximately every 3.8 milliseconds.

Referring still to FIG. 5, the prediction logic 125 may be implemented either through hardware or software, as will be apparent to one skilled in the art. The predicted digital value generated by the prediction logic 125 preferably is used as a starting point for subsequent digital code searching. The prediction logic 125 receives as an input the digital conversion code ADC[N:0] from previous digital conversion(s). The output of prediction logic 125 preferably is provided as an input to the digital counter 110 to provide a starting point for the counter to perform searching. In the preferred embodiment, the prediction logic 125 performs a linear extrapolation based upon the most recent digital conversion codes generated by the ADC 100. If the previous two digital conversion codes are used ($x_{t-2}$ and $x_{t-1}$, respectively), then the slope $x_s$ of the electrogram can be calculated as follows:

$$x_s = x_{t-1} - x_{t-2}$$

The digital code prediction for the current sample $x_t$, then is calculated as:

$$x_t = x_{t-1} + x_s$$

The digital code prediction $x_x$ then is used as the starting point in the search for the correct digital code for the electrogram signal. Thus, for example, if the previous two digital conversions were 00001000 (an 8-bit binary representation of 8) for $x_{t-2}$ and 00001010 (an 8-bit binary representation of 10) $x_{t-1}$, then the predicted value for $x_t$ would be 00001100 (an 8-bit binary representation of 12).

As will be apparent to one skilled in the art, if the digital conversion code did not change for $x_{t-2}$ and $x_{t-1}$ (i.e., $x_{t-2} = x_{t-1}$), then the predicted value for the digital code $x_t$ would be set equal to $x_{t-1}$. As an alternative to using a linear extrapolation technique to determine the predicted value for the digital code $x_t$, the predicted value may simply be set equal to the previous digital conversion code $x_{t-1}$. Using the previous conversion code $x_{t-1}$ as the predicted value $X_t$ simplifies the logic for the predictor 125, as will be apparent to one skilled in the art.

As noted, the digital counter 110 receives the predicted digital code from prediction logic 125. The counter 110 also receives several more control input signals (shown as UP/DOWN, and COUNT) from the control logic 150, indicating the direction (UP or DOWN) in which the counter should count, and when the counter should count (based upon the assertion of the COUNT signal). The digital output of the digital counter 110 is provided as an input to the control multiplexer 135, and as an input to latch 195. As shown in FIG. 5, the output of the digital counter has a bit width N. The digital counter 110 preferably operates in accordance with normal convention to provide an incremental count once during each clock cycle.

The successive approximation logic 120 receives a control signal (referred to as COMP) from the control logic 150 which controls the operation of the successive approximation logic 120. The successive approximation logic 120 also receives as an input the output signal from comparator 185. The successive approximation logic 120 produces a digital signal with a bit width N to the control multiplexer 135. The successive approximation logic 135 preferably operates in accordance with conventional techniques to generate a digital conversion code for an analog signal by determining the proper value of each bit in the digital code successively, upon receipt of the COMP signal from the control logic 150. The control multiplexer 135 receives digital code values from the counter 110 and successive approximation logic 120. In addition, the control multiplexer 135 also receives a SELECT control input signal from the control logic 150, that indicates the particular digital code input to be connected to the multiplexer output terminal. The output terminal of the control multiplexer 135 couples electrically to adder 155.

Constant multiplexer 145 preferably includes three data inputs, identified as the values 0 (zero), −C, and +C. In the preferred embodiment, each of these signals are provided in a binary format. The values −C and +C indicate plus and minus values for a constant value C. Thus, if C is chosen as 7, then −C equates to a negative value for 7, and +C equates to a positive value of 7. The constant multiplexer receives a control input signal (SELECT) from the control logic 150. Because the constant multiplexer 145 selects one of three possible data input signals, the SELECT signal preferably comprises a two bit signal. The output terminal of the constant multiplexer 145 couples electrically to an input terminal of adder 155.

The adder 155 may comprise either an analog adder or a digital adder, as desired. Moreover, the functions of the adder 155 and DAC 175 may be combined in a single component. If an analog adder is provided, then preferably a summing DAC is used to combine the functions of adder 155 and DAC 175. In the embodiment shown in FIG. 5, the adder receives as inputs the output signal from the control multiplexer 135 and the output signal of the constant multiplexer 145. The output signal of the adder 155 is provided as an input signal to the DAC 175. In accordance with known techniques, the adder 155 adds the output signals received from multiplexers 135, 145 to produce a sum value. The sum value may be either a digital or analog value, as desired.

Referring still to FIG. 5, the DAC 175 receives the adder output signal, and according to techniques well known in the art, produces an analog output signal. In an exemplary embodiment, the functions of the DAC 175, adder 155, and sample and hold circuit 190 may be combined into a single summing DAC device. The analog output signal is provided as an input signal to a sample and hold circuit 190, which in turn connects to the comparator 185. The comparator 185 compares the analog signal generated by DAC 175 with the sampled analog input (the electrogram) signal, indicated as $V_{in}$. If the voltage of $V_{in}$ is greater than the analog output signal from the DAC 175, the comparator 185 produces an output signal with a predetermined state (either a HIGH logic state or a LOW logic state). Conversely, if the voltage of $V_{in}$ is less than the analog signal from DAC 175, the comparator produces an output signal with the opposite state. The output signal from comparator 185 is provided as an input signal to the control logic 150 and to the successive approximation logic 120.

The control logic 150 receives a CLEAR signal as an input to control the timing and sequence of ADC operations. The control logic 150 also receives as an input the output signal of the comparator 185 to indicate the magnitude of the converted analog value relative to the voltage of the electrogram signal. The control logic 150 provides multiple output signals to control and orchestrate the operation of the logic comprising the ADC 100. In particular, the control logic 150 provides the COUNT and UP/DOWN control signals to the counter 110 to control counter operation. Similarly, the control logic 150 provides the comparison signal (COMP) to the successive approximation logic 120 which functions as a clocking input signal. The control logic 150 further controls the selection of input signals by both the control multiplexer 135 and the constant multiplexer 145. Lastly, the control logic 150 provides control signals (shown as ENABLE and CLEAR) to latch 195 to control the operation of those devices. The control logic may be implemented with programmable logic, if desired. In the preferred embodiment, the control logic 150 comprises a programmable logic array; one skilled in the art will understand, however, that the control logic also could be implemented with a microprocessor, or other processing circuitry.

The latch 195 receives the digital code value from the control multiplexer 135. The latch 195 also receives control input signals (shown as ENABLE and CLEAR) from the control logic 150. One skilled in the art will understand that other control signals may also be provided to increase the functionality of the latch. The output of the latch 195 connects to the ADC output bus ADC[N:0]. Depending upon the state of the ENABLE and CLEAR signals from control logic 150, the latch 195 either ignores the digital code value (if not enabled), stores the digital code values (if enabled), resets the latch contents (if cleared), or outputs the digital code value currently stored as the ADC output signal (if not cleared). Thus, when enabled, the latch 195 accepts the digital code value, and temporarily stores that value. On the subsequent clock cycle, the control logic may remove that value from the latch without providing an output signal on the ADC bus output by clearing the latch. The control logic 150 indicates that the stored value should be output onto the ADC data bus by not clearing the latch (i.e., by not asserting the CLEAR signal).

Figure 6:
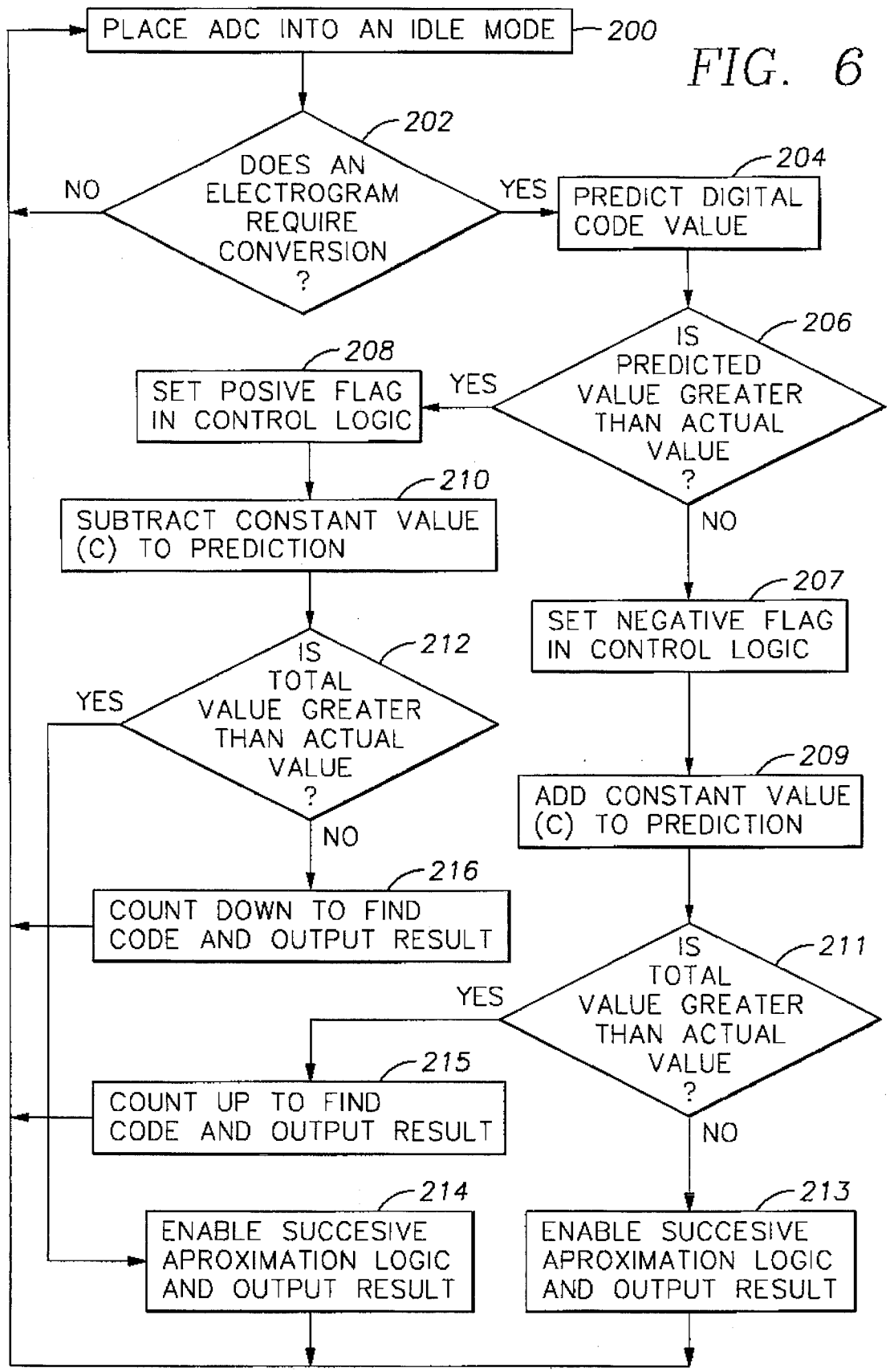
FIG. 6 is a flow chart illustrating the operation of the ADC of FIG. 5.

Referring now to FIGS. 5, and 6, the operation of the ADC 100 will now be described. As shown in step 200, the ADC 100 conserves power and extends the life of the battery by reverting to an idle state if no activity is required on its part in order to conserve power and extend the life of the battery. If an electrogram requires conversion (step 202), then the ADC begins its routine to calculate the best digital code representation for the electrogram signal. In the preferred embodiment, the period for conversion is preset by the selection of the desired sampling frequency.

According to the preferred embodiment (which presumes an eight-bit digital code length), the present invention always determines the proper digital code for the electrogram within a maximum period (such as, for example, ten clock cycles). Because of the tendency of certain electrograms to have portions that do not change, the present invention implements a technique by which the correct digital code, on average, will be found in less than eight clock cycles.

The conversion of an electrogram signal begins by predicting a digital value for the electrogram (step 204). The prediction is made by prediction logic 125, preferably using linear extrapolation. The predicted digital value is supplied to counter 110, which transmits the predicted value to the adder 155 through appropriate selection by the control multiplexer 135. The constant multiplexer provides a 0 input value to the adder 155. The adder then provides the unchanged predicted value to the DAC 175 where it is converted to an analog value.

In step 206, the predicted value is compared in comparator 185 with the voltage of the electrogram signal (shown as $V_{in}$ in FIG. 5). If the predicted value is greater than the voltage of the electrogram, a positive flag is set in a dedicated register bit in the control logic. Conversely, if the predicted value is less than the actual value, a negative flag is set in a dedicated register bit in the control logic. Depending upon the status of the dedicated register bit, a constant value (C) is either added to the predicted value (step 209), or subtracted from the prediction (step 210), through appropriate selection of −C or +C by the constant multiplexer 145.

The resulting value obtained by the adder 155 is again converted to an analog signal and compared to the actual electrogram voltage in either step 211 or 212. In accordance with the preferred embodiment (where it would take eight clock cycles to determine the correct eight bit digital code using successive approximation techniques), the constant value (C) is set equal to 7 or 8. If the value 7 is used as the constant (C), the successive approximation logic 120 is selected if it would take 8 or more clock cycles for linear searching to find the correct digital code. If the value 8 is used as the constant (C), the successive approximation logic 120 only is selected if it would take more than 8 clock cycles to find the correct digital code. Thus, if the voltage of the electrogram signal is not within the predicted value by a range (plus or minus) defined by the constant value (C), this indicates that it will take more than C clock cycles to find the correct digital code using linear searching. Conversely, if the electrogram signal is within the predicted code by the tolerance established by the constant value (C), then linear searching will permit the correct code to be found more expeditiously than successive approximation searching. By setting C equal to the number of cycles it would take to find the correct code using successive approximation, the system is able to determine which technique will be faster, and to implement that technique for each sampling point on the electrogram signal. The selection of successive approximation logic or digital counter searching is shown in steps 213, 214, 215, and 216 respectively. After the searching is complete, the ADC output is determined and provided as an output signal from the ADC 100.

FIG. 3 is a state diagram illustrating the states available in the present invention. In state 300, the ADC is idle. When conversion is required, the ADC prepares a prediction (state 302), which is used to determine a sign (state 304) for the prediction. The sign indicates whether the prediction if greater than or less than the actual electrogram voltage. In state 308, the ADC determines whether the actual electrogram voltage is within a predetermined range (plus or minus the constant C) of the predicted value. Based upon that determination, the ADC selects a mode for finding the correct digital code. If the actual electrogram voltage is not within the tolerance, successive approximation conversion (SAC) is selected in state 310. If the actual electrogram voltage is within the tolerance, then the ADC either counts up (state 312) or down (state 314) based upon the sign determined in state 304. The result of the search then is provided to the prediction circuitry and provided as an output for the ADC. Subsequently, the ADC returns to the idle mode in state 300.

While a preferred embodiment of the invention has been shown and described, modifications thereof can be made by one skilled in the art without departing from the spirit of the invention.

I claim:

1. An analog-to-digital converter in an implantable device for periodically converting an electrogram signal into a digital code value to permit storage in a memory device, comprising:

prediction logic for predicting a value for the digital code and producing a prediction output signal;

a digital counter receiving said prediction output signal, said digital counter being capable of generating a digital code output signal;

successive approximation logic capable of determining digital code conversions on a bit-by-bit basis, and producing a digital code output signal;

a digital-to-analog converter;

a control multiplexer connected to said digital counter and to said successive approximation logic for selectively coupling the digital code output signal from either said digital counter or said successive approximation logic to said digital-to-analog converter, said digital-to-analog converter converting said digital code output signal into an analog signal;

a comparator which compares said analog signal with said electrogram signal, and produces an output signal indicative of which signal has a greater magnitude; and control logic electrically coupled to said control multiplexer and to said comparator, said control logic receiving said comparator output signal, and based upon said comparator output signal, transmitting a signal to said control multiplexer to control the selection of the digital code output signal from either said digital counter or said successive approximation logic.

2. An analog-to-digital converter as in claim 1, further comprising an adder coupled between said control multiplexer and said digital-to-analog converter, said adder receiving as an input the digital code output signal from either said digital counter or said successive approximation logic, as selected by said control multiplexer.

3. An analog-to-digital converter as in claim 2, wherein the adder comprises an analog device.

4. An analog-to-digital converter as in claim 2, wherein the adder comprises a digital device.

5. An analog-to-digital converter as in claim 2, further comprising a constant multiplexer providing a second input signal to said adder, said constant multiplexer being capable of selecting either a negative constant value, a positive constant value, or zero, as the second input signal to said adder.

6. An analog-to-digital converter as in claim 5, wherein said constant multiplexer receives a control input signal from said control logic to control the selection of the second input signal to said adder.

7. An analog-to-digital converter as in claim 6, further comprising a clock which provides a clock signal to said control logic for synchronizing the operation of said analog-to-digital converter.

8. An analog-to-digital converter as in claim 7, wherein said digital code output signal comprises N bits, and said analog-to-digital converter generates a correct digital code output signal for said electrogram signal in not more than N+3 clock cycles.

9. An analog-to-digital converter as in claim 8, wherein said prediction output signal is compared with said electrogram signal to determine whether the prediction is above or below the correct digital code output signal.

10. An analog-to-digital converter as in claim 9, wherein said control logic, in response to the determination of whether the prediction is above or below the correct digital code output signal, produces the control signal which is provided as input to said constant multiplexer, causing said constant multiplexer to couple either said negative constant value or said positive constant value to said adder, to produce a sum which then is compared in said comparator to said electrogram signal.

11. An analog-to-digital converter as in claim 10, wherein said control logic transmits the signal to said control multiplexer to control the selection of the digital code output signal from either said digital counter or said successive approximation logic, based upon the comparison of the sum to said electrogram signal.

12. An analog-to-digital converter as in claim 1, wherein said prediction logic predicts the digital code value based upon a previous digital code conversion.

13. An analog-to-digital converter as in claim 12, wherein said prediction logic implements a linear extrapolation technique to predict the digital code value.

14. An analog-to-digital converter as in claim 1, wherein digital counter counts consecutively using the prediction output signal from said prediction logic as a starting point.

15. An analog-to-digital converter as in claim 14, wherein said digital counter receives an input signal from said control logic which controls the direction in which said digital counter counts.

16. An analog-to-digital converter as in claim 15, wherein said digital counter counts in response to a count control signal from said control logic.

17. An analog-to-digital converter as in claim 16, wherein the output of said digital counter also is provided to a latch, and said latch couples to an output bus for said analog-to-digital converter.

18. An analog-to-digital converter as in claim 17, wherein said latch receives as inputs control signals from said control logic which determine whether the latch provides the output of said digital counter onto said output bus of said analog-to-digital converter.

19. An analog-to-digital converter as in claim 1, wherein said successive approximation logic also connects to said comparator to receive said comparator output signal.

20. An analog-to-digital converter as in claim 19, wherein said successive approximation logic determines a bit of a correct digital code output signal in response to a control signal from said control logic.

21. An analog-to-digital converter as in claim 20, wherein the output of said successive approximation logic also is provided to a latch, and said latch couples to an output bus for said analog-to-digital converter.

22. An analog-to-digital converter as in claim 21, wherein said latch receives as inputs control signals from said control logic which determine whether the latch provides the output of said digital counter onto said output bus of said analog-to-digital converter.

23. A low power analog-to-digital converter for an implantable device, said analog-to-digital converter periodically generating a digital code for an electrogram signal comprising:
a counter capable of implementing a linear search for the digital code;
successive approximation logic capable of implementing a successive approximation search for the digital code; and
control logic for selecting whether to implement the linear search or the successive approximation search.

24. An analog-to-digital converter as in claim 23, further comprising a comparator for comparing the search values of said counter or said successive approximation logic with said electrogram signal.

25. An analog-to-digital converter as in claim 24, further comprising a digital-to-analog converter for converting the search values of said counter or said successive approximation logic to an analog signal for comparison with said electrogram signal by said comparator.

26. An analog-m-digital converter as in claim 24, wherein the analog-to-digital converter is implemented with CMOS components, and said control logic places said CMOS components in an idle state after the digital code is found.

27. An analog-to-digital converter for obtaining digital code values for sampled points in an electrogram signal as part of an implantable device, comprising:
prediction logic for generating a digital code value prediction for a sampled point in said electrogram signal;
selection circuitry for selectively adding a constant value to said digital code value prediction;
a digital-to-analog converter for obtaining an analog representation of the digital code value prediction;
a comparator for comparing the analog representation with the sampled point in said electrogram signal, and producing an output signal indicating a relative magnitude of the analog representation and the electrogram signal;
control logic coupled to said comparator for receiving said output signal indicative of the relative magnitude of the analog representation of the digital code value prediction and the electrogram signal, said control logic generating a select signal to said selection circuitry causing the constant value to be added to said digital code value prediction, with the sign of the constant value determined by the output signal from said comparator.

28. An analog-to-digital converter as in claim 27, wherein the digital code value prediction with the constant value added thereto produces a sum value, and the sum value is converted into an analog value by said digital-to-analog converter and compared in said comparator with the sampled point in said electrogram signal, to produce an output signal for said comparator indicating the relative magnitude of the sum value to the sampled point in said electrogram signal.

29. An analog-to-digital converter as in claim 28, wherein the control logic implements either a linear search for the digital code or a successive approximation search for the digital code based upon the output signal of said comparator indicative of the relative magnitude of the sum value to the sampled point in said electrogram signal.

30. A method for converting an electrogram signal into a digital code for storage in memory within an implantable medical device, comprising the steps of:
(a) predicting a digital code value for a sampled point on said electrogram signal;
(b) determining whether the predicted digital code value is greater than the sampled point;
(c) adding a constant value to the predicted digital code to produce a sum value, with the sign of the constant value dependent upon the determination in step (b);
(d) determining whether the sum value is greater than the sampled point; and
(e) selecting a search technique for obtaining the digital code based upon the results of step (d).

31. A method as in claim 30, wherein the step (step a) of predicting a digital code value for a sampled point on said electrogram signal includes the steps of:

(a)(1) storing the previous two digital code conversions and;

(a)(2) determining the rate of change between the previous two digital code conversions; and (a)(3) adding the rate of change to the previous digital code conversion $x_{t-1}$ to obtain the predicted digital code value.

32. A method as in claim 30, wherein the step (step b) of determining whether the predicted digital code value is greater than the sampled point includes the steps of;

(b)(1) converting the predicted digital code value to an analog signal;

(b)(2) comparing the analog signal to the sampled point in a comparator to determine the relative magnitude of the analog signal and the sampled point; and (b)(3) producing an output signal indicative of the relative magnitude of the analog signal and the sampled point.

33. A method as in claim 32, wherein the step (step c) of adding a constant value to the predicted digital code to produce a sum value includes the steps of;

(c)(1) receiving the output signal of step (b)(3);

(c)(2) generating a control signal to control selection of either a negative constant value or a positive constant value as an input to an adder, based upon the status of the output signal of step (b)(3); and (c)(3) adding the negative constant value or the positive constant value to the predicted digital code to obtain the sum value.

34. A method as in claim 33, wherein the step (step d) of determining whether the sum value is greater than the sampled point includes the steps of;

(d)(1) convening the sum value to an analog signal;

(d)(2) comparing the analog signal to the sampled point in a comparator to determine the relative magnitude of the analog signal and the sampled point; and (d)(3) producing an output signal indicative of the relative magnitude of the analog signal and the sampled point.

35. A method as in claim 34, wherein the step (step e) of deciding which search method to use for the digital code includes the steps of;

(e)(1) receiving the output signal of step (d)(3);

(e)(2) determining whether the output signal of step (d)(3) is different than the output signal obtained in step (b)(3); and (e)(3) selecting a search method based upon the determination in step (e)(2).

36. A method as in claim 30, wherein a successive approximation search method is used if the electrogram signal value is outside the range of the predicted digital value, plus or minus the constant value.

37. A method as in claim 30, wherein a linear search method is used if the electrogram signal value is within the range of the predicted digital value, plus or minus the constant value.

* * * * *